(12) United States Patent
Ballantine et al.

(10) Patent No.: US 6,984,593 B2
(45) Date of Patent: Jan. 10, 2006

(54) BETA CONTROL USING A RAPID THERMAL OXIDATION

(75) Inventors: Arne W. Ballantine, Round Lake, NY (US); Douglas D. Coolbaugh, Essex Junction, VT (US); Steve S. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/653,912

(22) Filed: Sep. 4, 2003

(65) Prior Publication Data

US 2004/0041238 A1 Mar. 4, 2004

Related U.S. Application Data

(63) Continuation of application No. 09/165,946, filed on Oct. 2, 1998, now abandoned.

(51) Int. Cl.
*H01L 21/31* (2006.01)
*H01L 21/469* (2006.01)

(52) U.S. Cl. ............... 438/787; 438/318; 438/770; 438/981; 257/526; 257/552; 257/585; 257/593

(58) Field of Classification Search ........ 438/353–355, 438/423, 981, 318–320, 365, 770, 778, 787; 257/506, 526, 552, 565, 584–587, 593
See application file for complete search history.

(56) References Cited

U.S. PATENT DOCUMENTS

| | | | |
|---|---|---|---|
| 4,113,515 A | 9/1978 | Kooi et al. | |
| 4,562,640 A | 1/1986 | Widmann et al. | |
| 4,755,487 A | 7/1988 | Scovell et al. | |
| 4,843,030 A | 6/1989 | Eden et al. | |
| 4,882,294 A | 11/1989 | Christenson | |
| 5,091,760 A | 2/1992 | Maeda et al. | |
| 5,111,266 A | 5/1992 | Furumura et al. | |
| 5,130,885 A | 7/1992 | Fazan et al. | |
| 5,151,387 A | 9/1992 | Brady et al. | |
| 5,180,688 A | 1/1993 | Bryant et al. | |
| 5,194,397 A | 3/1993 | Cook et al. | |
| 5,268,324 A | 12/1993 | Aitken et al. | |
| 5,476,799 A | 12/1995 | Sakamoto et al. | |
| 5,489,542 A | 2/1996 | Iwai et al. | |
| 5,635,409 A * | 6/1997 | Moslehi .................. | 438/7 |
| 5,646,073 A | 7/1997 | Grider et al. | |
| 2003/0234417 A1 * | 12/2003 | Raaijmakers et al. ....... | 257/309 |

FOREIGN PATENT DOCUMENTS

| | | |
|---|---|---|
| EP | 0196155 A3 | 10/1986 |
| JP | 06318588 A * | 11/1994 |
| JP | 8-213492 | 6/1996 |

OTHER PUBLICATIONS

Moslehi et al., "Thin SiO2 insulators grown by rapid thermal oxidation of silicon," Oct. 1985, Applied Physics Letters, vol. 47, (12), pp. 1353-1355.*
IBM Technical Disclosure Bulletin, "High Performance FET Technology," Apr. 1981, vol. 23, issue 23, pp. 4950-4953.*

* cited by examiner

*Primary Examiner*—Tom Thomas
*Assistant Examiner*—Matthew E. Warren
(74) *Attorney, Agent, or Firm*—Connolly Bove Lodge & Hutz LLP; William Sabo

(57) ABSTRACT

A method of forming semiconductor device treating a surface of a substrate to produce a discontinuous growth of a material on the surface through rapid thermal oxidation of the substrate surface at a temperature of less than about 700° C.

18 Claims, 3 Drawing Sheets

BETA CONTROL USING A RAPID THERMAL OXIDATION

CROSS-REFERENCE TO RELATED APPLICATION

This is a continuation of application Ser. No. 09/165,946, filed Oct. 2, 1998, ABN the entire contents of which is specifically incorporated by reference and for all purposes.

FIELD OF THE INVENTION

The present invention relates to methods for forming semiconductor devices including structures for controlling characteristics of current in the semiconductor devices. The present invention also relates to semiconductor devices that include the structures. In particular, the present invention relates to CMOS devices. More particularly, the present invention relates to bipolar transistors.

BACKGROUND OF THE INVENTION

As described above, the present invention particularly relates to bipolar transistors. FIG. 1 illustrates an example of a NPN bipolar transistor. The transistor illustrated in FIG. 1 includes a contact 1. The contact 1 may be made of a semiconductor material, such as polycrystalline silicon.

The contact 1 is formed over a region of a substrate 3 at a location where an emitter 5 of the transistor has been formed. A layer 7 of a dielectric material may be arranged on the substrate between the emitter 5 and the contact 1. Often, the dielectric material of the layer 7 is an oxide.

Below emitter 5 lies the base region 9 of the transistor. Below region 9 lies collector 11. FIG. 1 also illustrates the doping and flow of current within an NPN bipolar transistor.

Under normal bias conditions, or forward active mode, the emitter-base (E-B) junction is forward biased, 5 and 9 in FIG. 1, and the collector base junction, 11 and 9 in FIG. 1. is reversed biased. Electrons are ejected from the emitter into the base. Then, the electrons diffuse across the base region where they are swept across the reverse biased C-B junction into the collector. The collector current $I_C$ is associated with the flows of electrons from the emitter. On the other hand, the base current $I_B$ is a function of the holes ejected from the base region. The holes can either recombine in the emitter or flow into the emitter contact region 1, which is usually highly doped polycrystalline silicon.

The current again, Beta, may be described by the relationship between the collector current and base current. Beta is defined as (collector current)/(base current). In other words, beta equals $I_C/I_B$. Generally, the desired value of Beta is 100.

Resistance created by dielectric material of region 7 may affect the base current, as shown in FIG. 2. Along these lines, as the resistance created by the region between the contact 1 and the emitter 5 increases, base current decreases and, thus, Beta increases. In contrast, if the resistance of region 7 is low, the resulting base current is high and, thus, Beta is low.

Controlling the dielectric thickness in region 7 for a bipolar transistor is critical to controlling the current gain, Beta. When the dielectric material of region 7 is silicon oxide or dioxide, then the oxide may be created by exposing the surface of substrate 3 to an oxidizing environment. However, in some apparatuses utilized in forming transistors such as the transistor illustrated in FIGS. 1 and 2, the thickness of the deposited oxide may be difficult to control.

Typically, two processes have been used for depositing polycrystalline (polysilicon) on the emitter Si in the past. According to the first process, a horizontal CVD polysilicon deposition tube has been used extensively. The polysilicon is deposited on the single crystalline Si emitter after the single crystalline Si has been precleaned. In this case, the only oxidation that occurs in region 7 in the transistor illustrated in FIGS. 1 and 2 is that which occurs as the wafers enter the horizontal CVD tube. In this case, residual oxygen trapped in the system when the wafers are loaded may react with the emitter Si at insert temperatures of approximately 625° C. It has been found that very little oxidation of the emitter Si occurs in this instance. The resulting polysilicon is deposited on a Si surface with essentially native oxide.

Region 7 in this case has a very low resistance and, thus, Beta is low at approximately 50–60. Because the interfacial oxidation is essentially uncontrolled, Beta is found to be highly variable from lot to lot using the horizontal polysilicon deposition process.

In the second type of known process used, the polysilicon layer over the emitter may be deposited using a vertical chemical vapor deposition (CVD) polysilicon deposition tube in which the Si region of the emitter may be oxidized in situ, typically after an initial wet preclean. In this case, a batch of wafers may be loaded into the furnace, the chamber evacuated and then a mixture of an inert gas and oxygen may be leaked into the chamber at temperatures of approximately 600° C. In this case, Beta can be set to 100. However, different technologies of Bipolar transistors typically require different levels of interfacial oxide and, thus, need to be run separately. Also, variation of the level of oxidation across a batch of wafers can occur. In addition, the typical cost issues associated with batch versus single wafer processing are encountered.

SUMMARY OF THE INVENTION

In producing a solution to the above and other problems, at least some objects and advantages of the present invention provide a method of forming semiconductor device. According to the method, a surface of a substrate is treated to produce a discontinuous growth of a material on the surface through rapid thermal oxidation of the substrate surface at a temperature of less than about 700° C.

According to other aspects, the present invention provides a method of forming a semiconductor device. A layer of an electrically insulating material is formed between a substrate of monocrystalline semiconductor and a layer of polycrystalline semiconductor wherein the thickness of the oxide layer results in a common current gain of about 100 in an emitter of a bipolar transistor formed in the substrate.

Additional aspects of the present invention provide a method of forming a semiconductor device. The method includes forming a layer of an electrically insulating material between a substrate of monocrystalline semiconductor and a layer of polycrystalline semiconductor, wherein the oxide layer has a thickness of about 1–5 Å of grown oxide in addition to native oxide.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention.

Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which:

FIG. 3 represents a graph illustrating a relationship between thickness of an oxide layer formed according to an embodiment of a rapid thermal oxidation process according to the present invention with respect to temperature that the rapid thermal oxidation is carried out at;

FIG. 4 represents a graph illustrating one example of a relationship between the beta quantity of a transistor with respect to temperature that a rapid thermal oxidation process according to the present invention is carried out at;

DETAILED DESCRIPTION OF THE INVENTION

Figure 1:
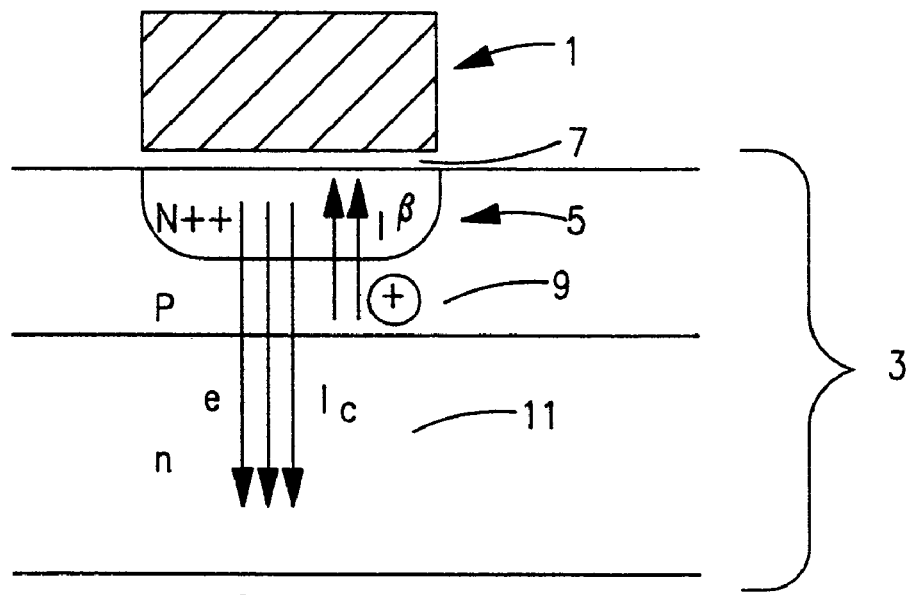
FIG. 1 represents a cross-sectional view of a NPN bipolar transistor.
Figure 2:
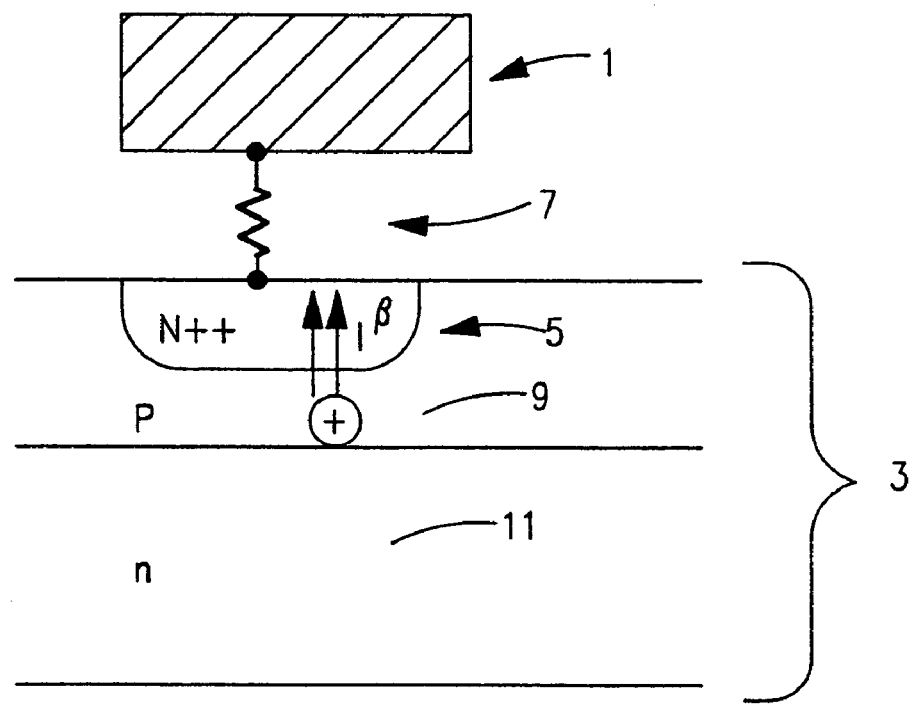
FIG. 2 represents a combined schematic and cross-sectional view of the embodiment of the transistor illustrated in FIG. 1.

The present invention provides a solution to the above problems by providing a process to control deposition of region 7 in a structure such as the transistor illustrated in FIGS. 1 and 2. The processes and resulting structures may also be utilized in other applications. It just happens that the process of the invention is particularly useful in transistors such as those shown in FIGS. 1 and 2.

By controlling the composition and physical characteristics of region 7, it follows that the present invention permits control of the value of beta in the resulting structure. The present invention accomplishes these and other objects by providing a process for creating a region of the material to form regions 7 in the structure illustrated in FIGS. 1 and 2.

According to one embodiment, the present invention provides a rapid thermal oxidation (RTO) process. The rapid thermal oxidation process is utilized to form a layer of oxide on the surface of the emitter 5 illustrated in FIGS. 1 and 2. The rapid thermal oxidation may be controlled to create oxide on at least of a portion of the emitter. In other words, it is necessary that the oxide cover the entire emitter area. One factor that may control the thickness of the oxide as well as the percentage of the emitter covered by the oxide is the desired value of beta, which as stated above may be affected by the thickness of the oxide layer.

Among the variables that may be controlled in the rapid thermal oxidation process are temperature and time. According to one embodiment, the rapid thermal oxidation process is carried out at about 500° C. The rapid thermal oxidation process may be carried out for about 5 seconds. An embodiment of a process according to the present invention included rapid thermal oxidation carried out at about 500° C. for about 5 seconds resulted in formation of an oxide layer having a thickness of about 6 Å. This oxide thickness includes about 4 Å of native oxide plus about 2 Å of oxide formed by the rapid thermal oxidation process. The resulting structure has a beta value of about 100. Without this process, the interface oxide was not well controlled and the resulting Beta value was at the low end of the process specification at a value of 60.

As referred to above, the silicon dioxide or oxide thickness described herein are defined as oxide that is thermally grown plus the native oxide already present on the wafer. For instance, after a preclean, a monocrystalline Si surface may include 5 Å of native oxide as measured with an ellipsometer commonly used for semiconductor manufacturing. After subjecting this wafer to the rapid thermal oxidation process described herein, the oxide may measure 7 Å. In this case, the oxide thickness is defined as a thermally grown oxide of 2 Å in addition to or plus (+) native oxide of 5 Å.

According to one example of the present invention, prior to deposition of the emitter polysilicon in bipolar transistor processing, the emitter monocrystalline silicon surface may be precleaned with some type of HF chemistry. Such chemistry is well know to those of ordinary skill in the art and, therefore, is not discussed further here. One of ordinary skill in the art could determine appropriate treatment including HF to utilize without undue experimentation.

All oxides may be removed from the surface of a monocrystalline silicon substrate such that only native oxide due to exposure of the silicon to the atmosphere remains on the silicon. At this time, typically, an oxide is grown on the surface of the monocrystalline silicon using a rapid thermal oxidation (RTO) process according to the present invention as described herein. The present invention typically results in the growth of about 1 Å to about 5 Å of thermal oxide. This level of thermal oxide is in addition to the native oxide present prior to the RTO process. The oxide level may be measured with an ellipsometer commonly used in semiconductor processing. Therefore, if there is approximately 8 Å of native oxide prior to the RTO process, the measured thickness may be about 9 Å to about 13 Å post RTO. After the process of the present invention, polysilicon may then deposited in a CVD reaction without any additional oxidation of the Si surface.

Figure 3:
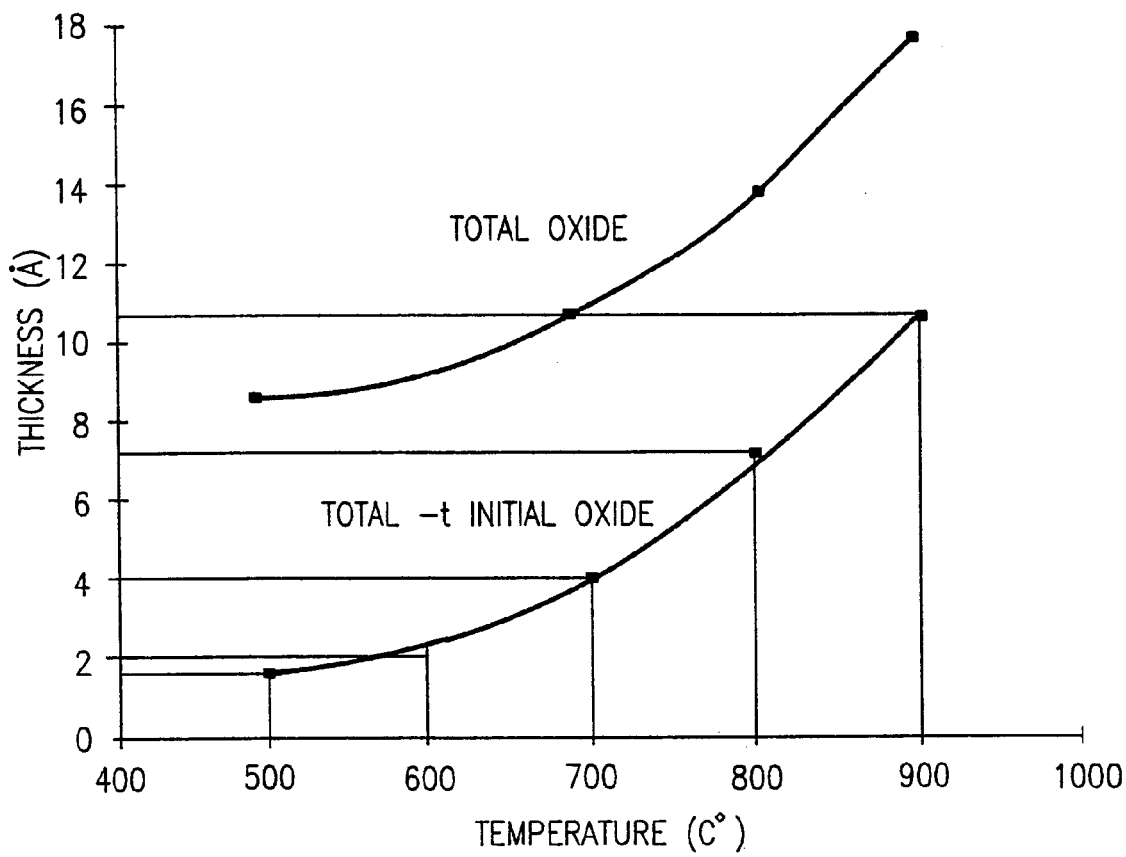

FIG. 3 illustrates a relationship between thickness of the oxide layer between the emitter and the contact with respect to the temperature that the rapid thermal oxidation is carried out at. As can be seen in FIG. 3, the total oxide as well as the oxide grown by the rapid thermal oxidation process both increase as the temperature that the rapid thermal oxidation is carried out at increases.

Figure 4:
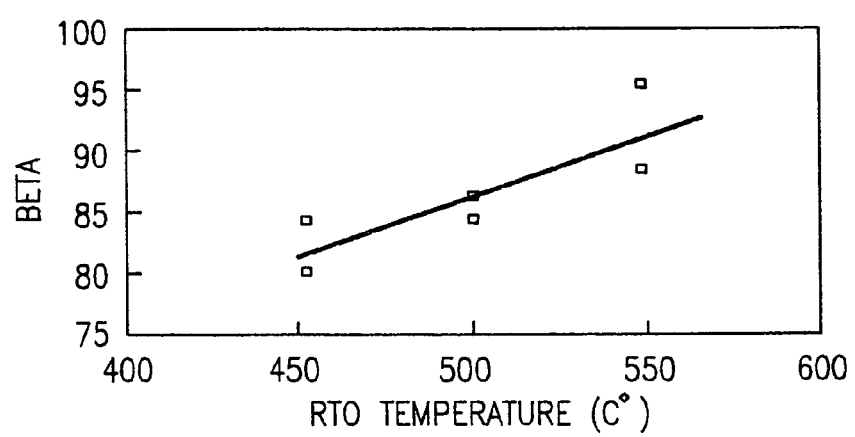

FIG. 4 represents a graph that illustrates a relationship between the beta value and the temperature that the rapid thermal oxidation is carried out. Since, as illustrated in FIG. 3, oxide thickness increases as temperature increases, it follows that beta will increase as the temperature that the rapid thermal oxidation is carried out at increases. This results because the base current decreases due to the increased interfacial oxide.

Controlling the silicon dioxide or oxide thickness in region 7 for a bipolar transistor is critical to controlling the current gain. If the interfacial oxide thickness of region 7 exceeds a thermally grown oxide thickness of up to approximately 5 Å plus native oxide, the base current will be low and the resulting Beta will be greater than about 150. However, if the interfacial oxide is in the range of 1–5 Å plus native oxide then Beta will be in the range of about 100. Low values of Beta will result when the interfacial oxide is low at the level of native oxide only.

Figure 5:
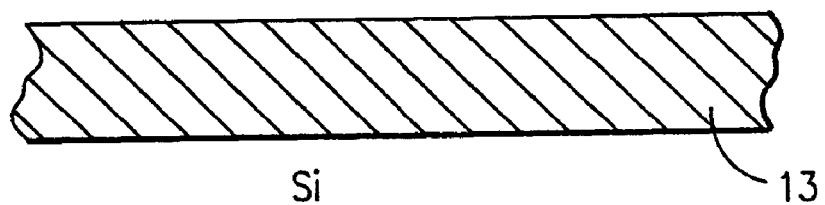
FIG. 5 represents a cross-sectional view of an embodiment of a polycrystalline silicon/monocrystalline silicon interface.

When polysilicon is deposited on the surface of the monocrystalline silicon substrate with different levels of thermally grown oxide as described above, the structures illustrated in FIGS. 5–7 may result. FIG. 5 shows a situation where polysilicon is deposited on a silicon surface with little oxide other than native oxide between the polysilicon and the monocrystalline silicon. The polysilicon seeds on the monocrystalline silicon base and the resulting polysilicon structure may include a significant level of epitaxially grown silicon but with many defects. In this case, the interfacial resistance is low and Beta will thus be low since the structure can result in high base current.

Figure 6:
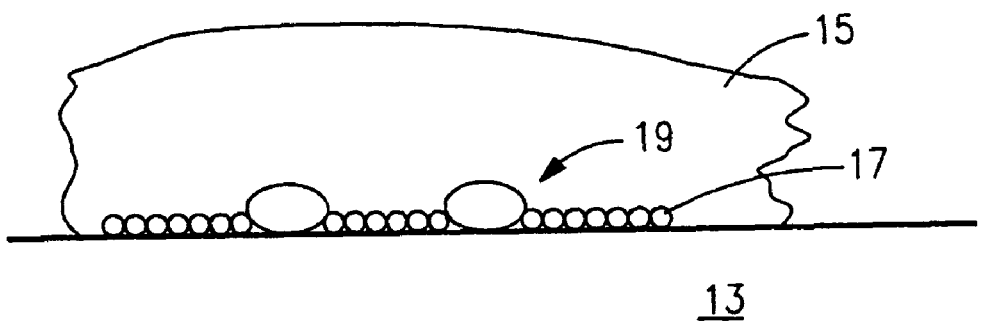
FIG. 6 represents a cross-sectional view of another embodiment of a polycrystalline silicon/monocrystalline silicon interface.

On the other hand, when the interfacial oxide is present in range of less than about 5 Å of thermally grown oxide plus native oxide, the structure illustrated in FIG. 6 results. In this case, the interfacial oxide 19 is not continuous. Where polysilicon is deposited over thin oxide, a normal polysilicon structure may result. Over the porous areas of the oxide film, the deposited silicon may be epitaxial silicon 17. In this area, there is low resistance. Because the film is discontinuous but uniform, the interface typically is very good for controlling the base current and, thus, Beta. The extreme ideal for controlling the base current and thus Beta. FIG. 6 depicts the discontinuous interfacial oxide as a plurality of "islands" of oxide, 19, separated by regions 17 of epitaxial silicon.

Figure 7:
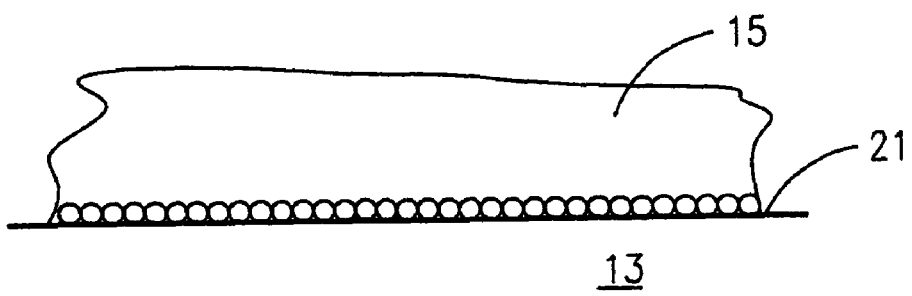
FIG. 7 represents a cross-sectional view of an additional embodiment of a polycrystalline silicon/monocrystalline silicon interface.

FIG. 7 illustrates an extreme case, where polysilicon is deposited on a monocrystalline silicon surface with a continuous oxide. In the structure shown in FIG. 7, the resulting film is entirely polysilicon with higher resistance than those described above. Thus, this structure results in high Beta.

A rapid thermal oxidation process according to the present invention may be carried out in a rapid thermal processor. Rapid thermal processors devices that can heat substrates rapidly to a target temperature or temperatures, maintain the substrates at the target temperature(s), and cool the substrates rapidly from the target temperature(s). These devices are often used in semiconductor manufacturing where wafers are placed through thermal processes. A rapid thermal processor can heat wafers at rates of about 5° C. to about 400° C./sec, with about 30° C./sec being typical. These processors can cool wafers at rates of about 5° C. to about 100° C./sec, with about 30° C./sec being typical.

Typically, rapid thermal processors are single wafer processors. In other words, they do not process batches of substrates or wafers simultaneously. Instead, they process one wafer at a time through a prescribed thermal cycle. Because of this, the chamber of a rapid thermal processor typically is small, especially in comparison to the size of the chambers of used in conventional furnace hot processing.

Additionally, rapid thermal processing systems typically are closed systems, with control of gas delivery and exhaust. Therefore, during processing, gas concentrations may easily be controlled. For example, oxygen concentration may be controlled during processing at levels of from about 100% pure $O_2$ down to about 10 ppm $O_2$.

According to the process of the present invention, a layer of $SiO_2$ or other oxide layer may be formed over the monocrystalline semiconductor. The oxide layer may be described as a monolayer or less. Less than a monolayer indicates that not all of the surface of the monocrystalline semiconductor is covered with oxide. Less than a monolayer indicates the layer is discontinuous. FIG. 6 illustrates the discontinuous layer of the present invention. FIG. 6 depicts the oxide layer as comprising a plurality of isolated regions 19. These isolated regions 19 may be termed "islands.".

One significant advantage of the present invention is that it can produce a very repeatable oxide layer. In other words, the coverage and thickness of the oxide on the surface of the monocrystalline semiconductor are very repeatable according to the present invention.

As described above, the thickness of oxide created by the rapid thermal oxidation according to the present invention may vary depending upon the temperature, time, pressure, and/or oxygen concentration at which the rapid thermal oxidation is carried out. Increasing the temperature, time, pressure, or oxygen concentration will have the effect of increasing the thickness of oxide grown. Several different temperature ranges may be included in various embodiments of the present invention. For example, the invention may be carried out at a temperature less than about 700° C.

Selecting the target temperature of the rapid thermal process at least partially determines the thickness of the oxide layer grown. The specific electrical needs of a particular semiconductor device will determine what thickness of oxide is required. Depending upon the desired electrical characteristics of the devices being created, an extended range of temperatures may be used. Rapid thermal processes within the temperature ranges described herein can result in anywhere from complete coverage of the monocrystalline semiconductor to partial coverage of the monocrystalline semiconductor.

According to one embodiment of the present invention, a device may perform optimally with rapid thermal oxidation at a temperature of about 450° C. Another device may require a rapid thermal oxidation at a temperature of about 475° C. A typical range for rapid thermal oxidation processing according to the present invention is about 450° C. to about 500° C. However, processing at less than about 450° C. may result obtaining lower beta values. Processing above about 500° C. may permit higher beta values to be obtained.

When temperature in the vicinity of about 700° C. are utilized, the resulting oxide layer may have a thickness of about 5 Å to about 10 Å. Alternatively, though reductions in time, pressure, or oxygen concentration, the oxide thickness may be no greater in thickness than about 5 Å. Alternatively, the oxide layer may have a thickness of about 2 Å to about 4 Å or from about 2 Å to about 3 Å when utilizing lower temperature processes. The specific thickness of oxide created may be determined by the rapid thermal oxidation process used, including manipulating the variables discussed herein.

As stated above, when a subsequent polycrystalline and/or amorphous semiconductor layer is deposited upon the semiconductor substrate, there is a tendency for the initial atoms of that added semiconductor layer to bond to the substrate with the monocrystalline pattern or orientation of the substrate. This is commonly referred to as epitaxial growth. The layer created by the present invention may provide a layer that reduces the tendency of that added semiconductor to deposit or grow epitaxially, or with the monocrystalline pattern of the substrate.

In the past, the problem of formation of single crystal semiconductor or monocrystalline semiconductor from polycrystalline and/or amorphous semiconductor was solved by oxidizing the surface of the monocrystalline semiconductor by bleeding $O_2$ gas or air in the polycrystalline semiconductor low-pressure chemical vapor deposition furnace. However, this known method does not produce reliably repeatable results. Additionally, an $O_2$ or air bleed in a furnace does not permit all wafers to receive the same oxide monolayer or fractional oxide layer. Furthermore, the $O_2$ or air bleed typically results in a reduced number of fractional wafers in the furnace load. Also, in furnace processing with the air or $O_2$ bleed, processing each wafer to with its own specific process is not possible. In the single wafer rapid thermal oxidation process, each wafer or lot of wafers may receive a different rapid thermal oxidation process, if wafer in a batch or lot of wafers may receive a different rapid thermal oxidation process, if desired, allowing wafers to intentionally, and controllably reach a range of performance values.

As stated above, processes according to the present invention may be utilized in a variety of applications in addition to the transistor illustrated in FIGS. 2 and 3. For example, the rapid thermal oxidation process according to the present invention may be utilized in processes that include trench formation in semiconductor wafers. The discontinuous oxide layer may also be deposited on a DRAM trench side wall. In fact, the present invention may be utilized in any application where polycrystalline and/or a amorphous semiconductor is deposited on monocrystalline semiconductor. Particularly, the present invention is useful where dislocations result from formation of single crystal semiconductor from polycrystalline and/or amorphous semiconductor.

Rather than an oxide layer, the layer between the monocrystalline semiconductor and polycrystalline and/or a amorphous semiconductor may be more broadly described as an electrically insulating material. The electric insulating material could be an oxide. However, it could also be a nitride and/or a nitridized oxide.

The present invention also includes semiconductor devices including a region of monocrystalline semiconductor and a region of polycrystalline semiconductor. A layer of a material is arranged between the region of monocrystalline semiconductor and polycrystalline semiconductor. The layer may be discontinuous. The layer between the monocrystalline semiconductor and monocrystalline semiconductor may include at least one of an oxide, a nitride, and a nitridized oxide. The layer may be formed by the rapid thermal oxidation process described above. If the layer includes a nitride and/or if the oxide is at least partially nitridized, the process may be altered to include steps to introduce nitrogen into the layer.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A method of forming semiconductor device, the method comprising:
treating a surface of a substrate to produce a region of dielectric material on the surface through rapid thermal oxidation of the substrate surface at a temperature of less than about 700° C., wherein the temperature is ramped up to the temperature of less than about 700° C. at a rate of about 5° C./sec to about 400° C./sec, wherein said region of dielectric material is in the form of a plurality of islands.

2. The method according to claim 1, wherein the temperature is about 450° C. to about 550° C.

3. The method according to claim 1, wherein temperature is about 450° C.

4. The method according to claim 1, wherein the temperature is about 475° C.

5. The method according to claim 1, wherein the dielectric region is an oxide layer.

6. The method according to claim 1; wherein the dielectric region has a thickness of about 5Å to about 10 Å.

7. The method according to claim 1, wherein the dielectric region has a thickness of no greater than about 5 Å.

8. The method according to claim 1, wherein the dielectric region has a thickness of about 2 Å to about 4 Å.

9. The method according to claim 1, wherein said dielectric region has a thickness of about 2 Å to about 3 Å.

10. The method according to claim 1, wherein the dielectric region is formed at an emitter interface prior to deposition of a non-monocrystalline semiconductor.

11. The method according to claim 1, wherein the dielectric region is deposited on a DRAM trench sidewall.

12. The method according to claim 1, wherein the dielectric region has a thickness that results in a common current gain of about 100 in an emitter of a bipolar transistor formed in and on the substrate.

13. The method according to claim 1, wherein the substrate is exposed to a temperature of about 450° C. to about 500° C. for about 5 seconds.

14. The method according to claim 1, wherein the temperature that the substrate is exposed to is ramped up to the temperature at a rate of about 50° C./sec.

15. The method according to claim 1, wherein the treatment occurs under $O_2$ gas at a concentration of about 100% to about 10 ppm.

16. The method according to claim 1, wherein the substrate is monocrystalline semiconductor.

17. A method of forming a semiconductor device, the method comprising:
forming a layer of an electrically insulating material between a substrate of monocrystalline semiconductor and a layer of polycrystalline semiconductor, wherein said insulating material comprises a plurality of islands, and wherein the thickness of said insulating material results in a common current gain of about 100 in an emitter of a bipolar transistor formed in the substrate.

18. The method according to claim 17, wherein said electrically insulating material includes at least one material selected from the group consisting of oxides, nitrides, and nitridized oxides.

* * * * *